(12) United States Patent
Chen

(10) Patent No.: US 7,600,558 B2
(45) Date of Patent: Oct. 13, 2009

(54) COOLER

(76) Inventor: Shyh-Ming Chen, 235 Chung-Ho Box 8-24, Taipei (TW)

(*) Notice: Subject to any disclaimer, the term of this patent is extended or adjusted under 35 U.S.C. 154(b) by 414 days.

(21) Appl. No.: 11/507,274

(22) Filed: Aug. 22, 2006

(65) Prior Publication Data

US 2008/0047693 A1 Feb. 28, 2008

(51) Int. Cl.
*H05K 7/20* (2006.01)
(52) U.S. Cl. ............... 165/80.3; 165/104.33; 361/700
(58) Field of Classification Search ............ 165/104.33; 361/700
See application file for complete search history.

(56) References Cited

U.S. PATENT DOCUMENTS

| | | | | |
|---|---|---|---|---|
| 6,796,373 B1* | 9/2004 | Li | ...................... | 165/104.21 |
| 6,918,429 B2* | 7/2005 | Lin et al. | ................... | 165/80.3 |
| 7,188,663 B2* | 3/2007 | Lin | ................... | 165/104.33 |
| 7,441,592 B2* | 10/2008 | Huang | ................... | 165/104.33 |
| 7,448,438 B2* | 11/2008 | Xia et al. | ................ | 165/104.33 |
| 2004/0037039 A1* | 2/2004 | Shimura et al. | ............. | 361/700 |
| 2005/0139347 A1* | 6/2005 | Chen et al. | ............. | 165/104.33 |
| 2006/0011329 A1* | 1/2006 | Wang et al. | ............. | 165/104.33 |
| 2006/0181848 A1* | 8/2006 | Kiley et al. | ................ | 361/697 |
| 2006/0238982 A1* | 10/2006 | Lee et al. | .................... | 361/700 |
| 2007/0215327 A1* | 9/2007 | Lai et al. | ................ | 165/104.33 |

* cited by examiner

*Primary Examiner*—Allen J Flanigan

(57) ABSTRACT

A cooler comprises a base, a set of radiator fins and a plurality of heat pipes going through the base and the radiator fins. The lower surface of the base is further provided with a recess wherein part of the heat pipes is exposed, whereby a heat-generating element will be embedded with in the recess, and whereby the heat generated in the element will be conducted quickly through the heat pipes to the radiator fins. Therefore, the heat-dissipation efficiency is enhanced.

6 Claims, 13 Drawing Sheets

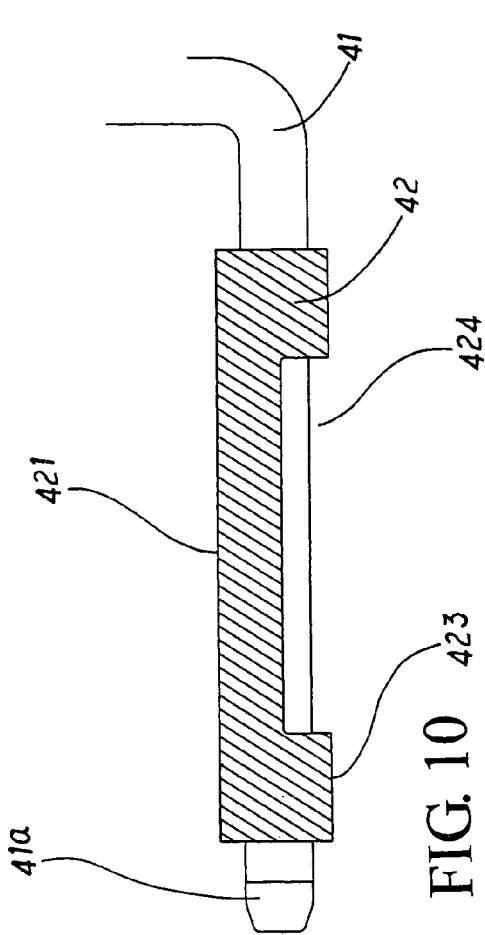
FIG. 10
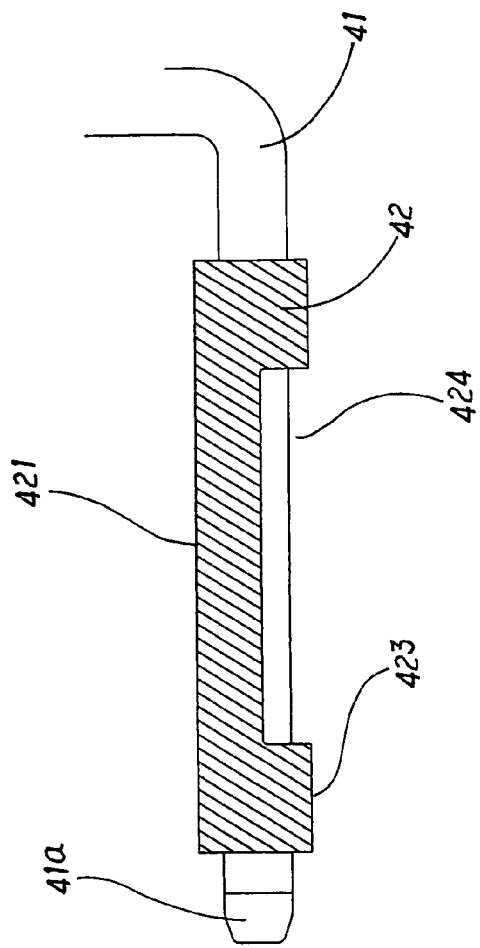
FIG. 11
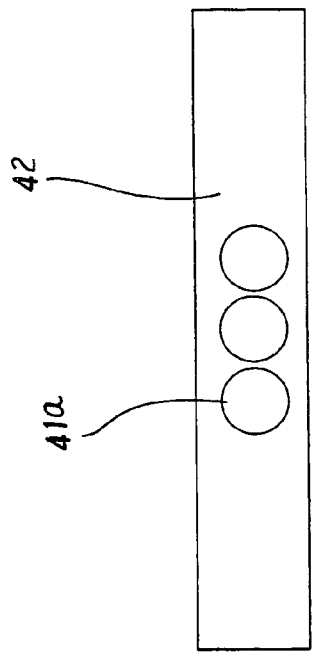
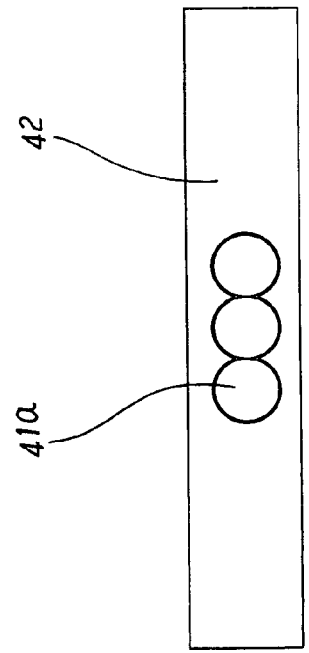

ies.
COOLER

FIELD OF THE INVENTION

The present invention relates to coolers for electronic elements, more particularly to a cooler with a bottom surface provided with a recess, whereby an electronic element will be embedded therein so as to contact directly at least with a heat pipe going along the bottom surface for better heat-dissipation efficiency.

BACKGROUND OF THE INVENTION

It has become a more and more important problem that heat generated within electronic elements in operation should be taken away quickly for maintaining the stable operation of an electronic device.

The importance of a cooler is in proportion with the computing speed of computers. Therefore, an efficient means for heat dissipation of the heat generated in electronic elements that restricts the operation temperature within an acceptable range is important for long-term, stable operation of computers. The most common means is heat sink assembly directly mounted on a heat-generating element. However, different configurations of heat sink assemblies have different heat-dissipation efficiencies.

As shown in FIG. 1, a conventional cooler 1 has a plurality of heat pipes 11 going through a base 12 connected to a heat-generating element 13; the other ends of the heat pipes 11 go through a set of radiator fins 14. Thereby, the radiator fins 14 will exchange heat with the surrounding cool air.

As shown in FIG. 2, a conventional cooler 2 has a base 22 with an upper waved surface 221. The grooves 222 extend in parallel with the grooves 242 formed under a set of radiator fins 24. A plurality of heat pipes 21 are sandwiched by some of the grooves 222, 242, whereby the heat absorbed by the base 22 will be conducted to the radiator fins 24 for exchanging heat with the surrounding cool air.

Although the above coolers of the prior art are made of material of high heat conductivity, the connection of the various components can not be perfect, and there will be gaps that causes extra heat resistances. Therefore, structural innovations aiming at improving heat conduction is important.

SUMMARY OF THE INVENTION

The primary objective of the present invention is to provide a cooler having a base provided with a recess for retaining a heat-generating electronic element. More specifically, the heat-generating element is housed within the recess when the cooler is mounted thereon. Thereby, the heat-generating element is in direct contact with the heat pipes exposed within the recess, and the heat generated in the element will be conducted quickly through the heat pipes to the radiator fins.

BRIEF DESCRIPTION OF THE DRAWINGS

FIG. 10 is a cross-sectional view of the second preferred embodiment showing the heat pipes before punching.

FIG. 11 is a cross-sectional view of the second preferred embodiment showing the heat pipes after punching.

The various objects and advantages of the present invention will be more readily understood from the following detailed description when read in conjunction with the appended drawings.

DETAILED DESCRIPTION OF THE PREFERRED EMBODIMENTS

Figure 1:
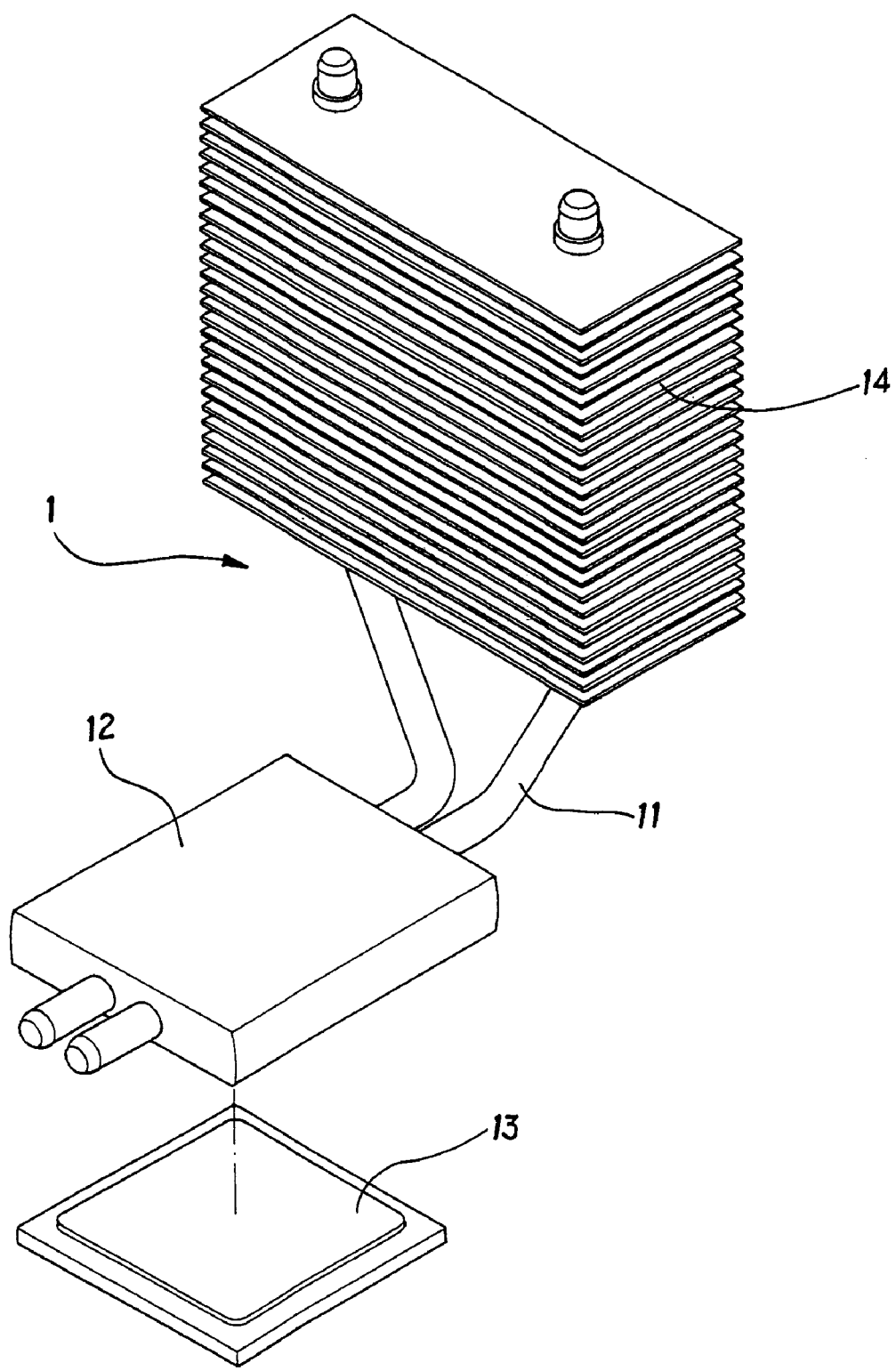
FIG. 1 is a perspective view of a cooler of the first type of the prior art.
Figure 2:
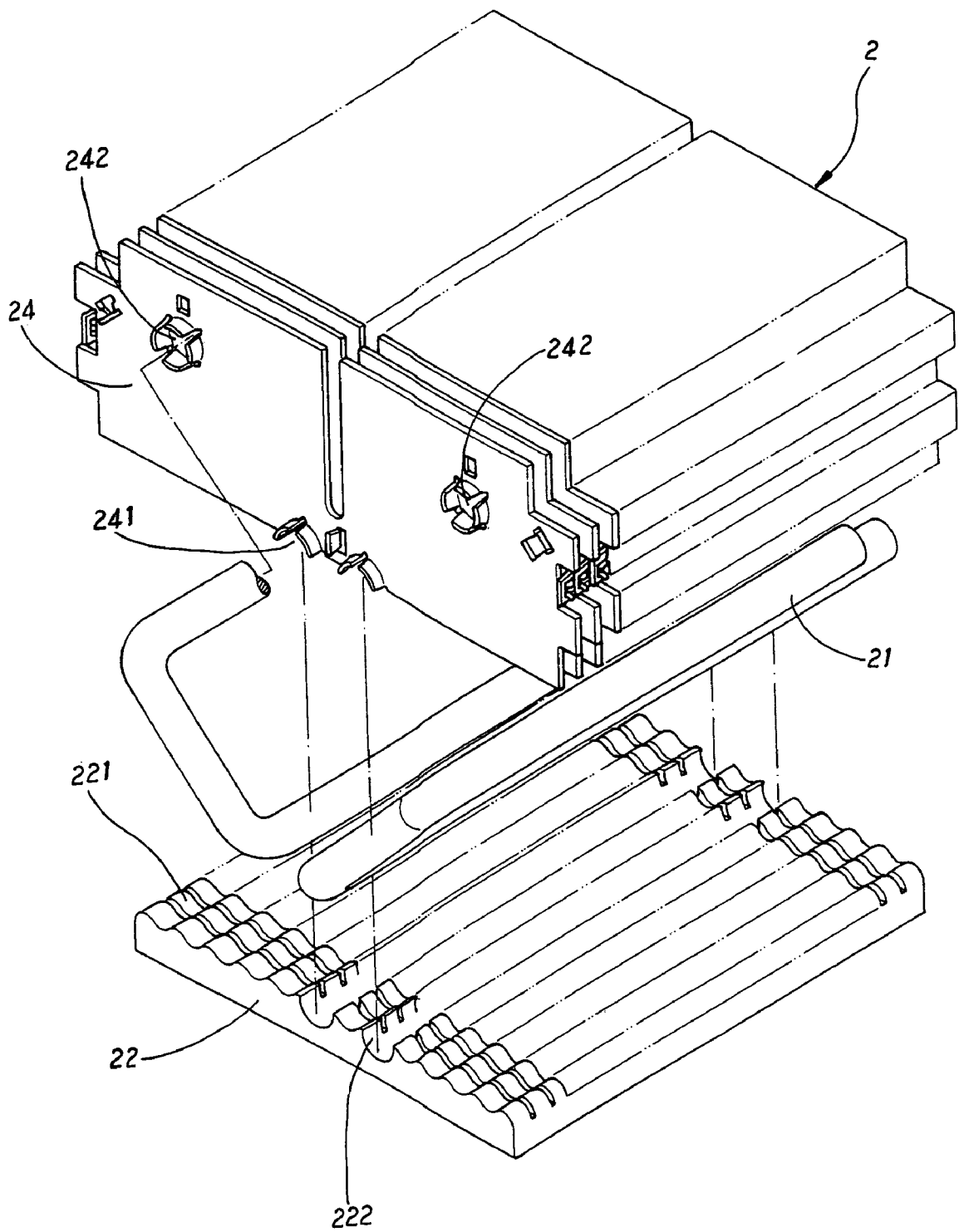
FIG. 2 is a perspective view of a cooler of the second type of the prior art.
Figure 3:
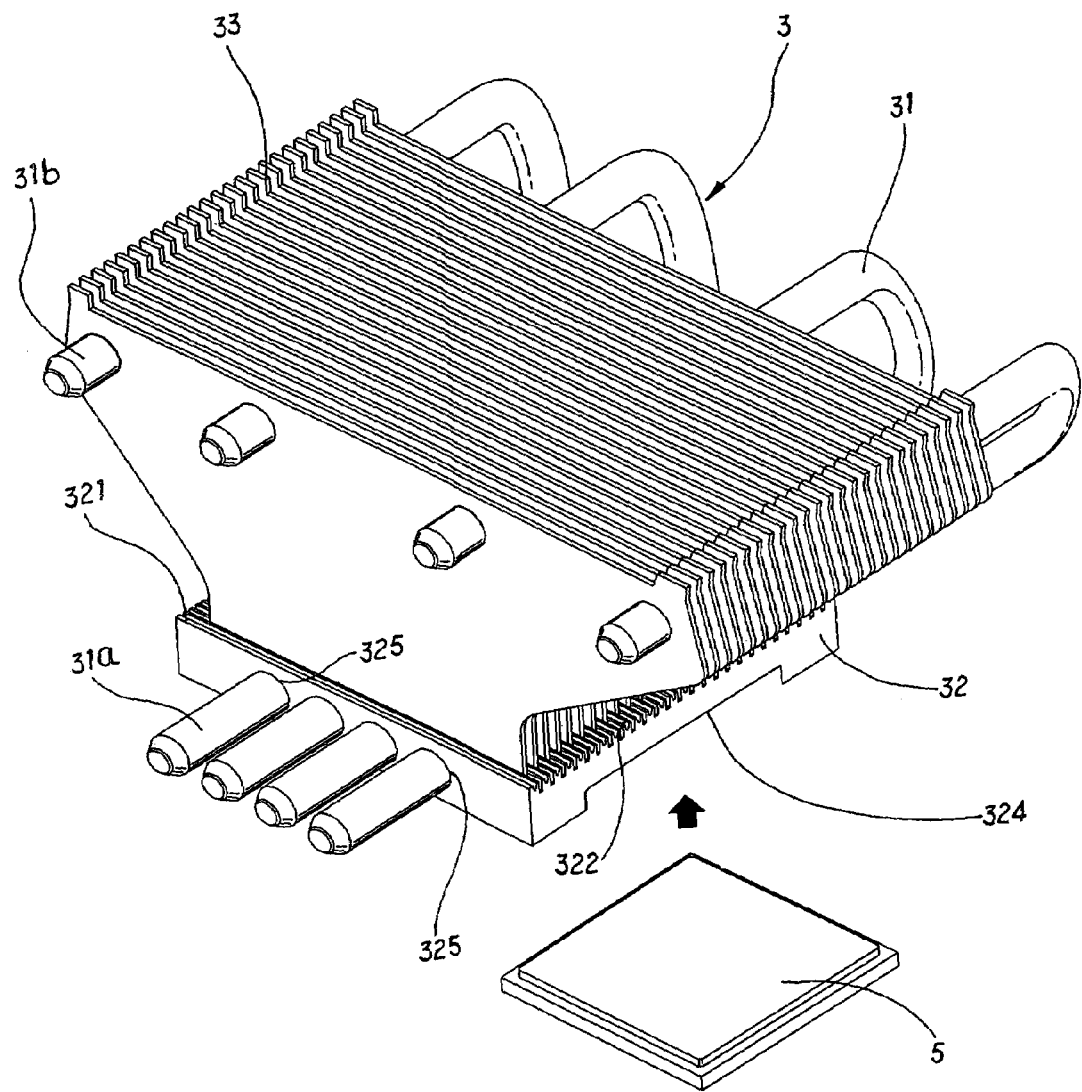
FIG. 3 is a perspective view of the first preferred embodiment of the present invention as a cooler.

Referring to FIG. 3, the first preferred embodiment of the present invention as a cooler 3 comprises a base 32, a set of radiator fins 33 and a plurality of heat pipes 31. The base 32 has a multitude of retaining slots 322 on the top surface thereof for respectively retaining the radiator fins 33. The base 32 further comprises a recess 324 on the bottom surface thereof taking the shape of a predetermined heat-generating element 5. The heat pipes 31 pass through the base 32 horizontally through holes 325 so that part of the heat pipes 31 is exposed in the recess 324.

The lower ends 31a of the lower terminals of the heat pipes 31 pass through the base 32, connecting the heat pipes 31 and the base 32. The heat pipes 31 are bent and folded so that the other terminals 31b thereof pass through the set of radiator fins 33 in the same horizontal direction, whereby the heat pipes 31 and the radiator fins 33 are connected. Since part of the heat pipes 31 is exposed within the recess 324, the heat-generating element embedded therein will contact the heat pipes 31 directly, whereby the heat generated in the element 5 will be conducted quickly through the heat pipes 31 to the radiator fins 33. Therefore, the heat-dissipation efficiency is enhanced.

Figure 4:
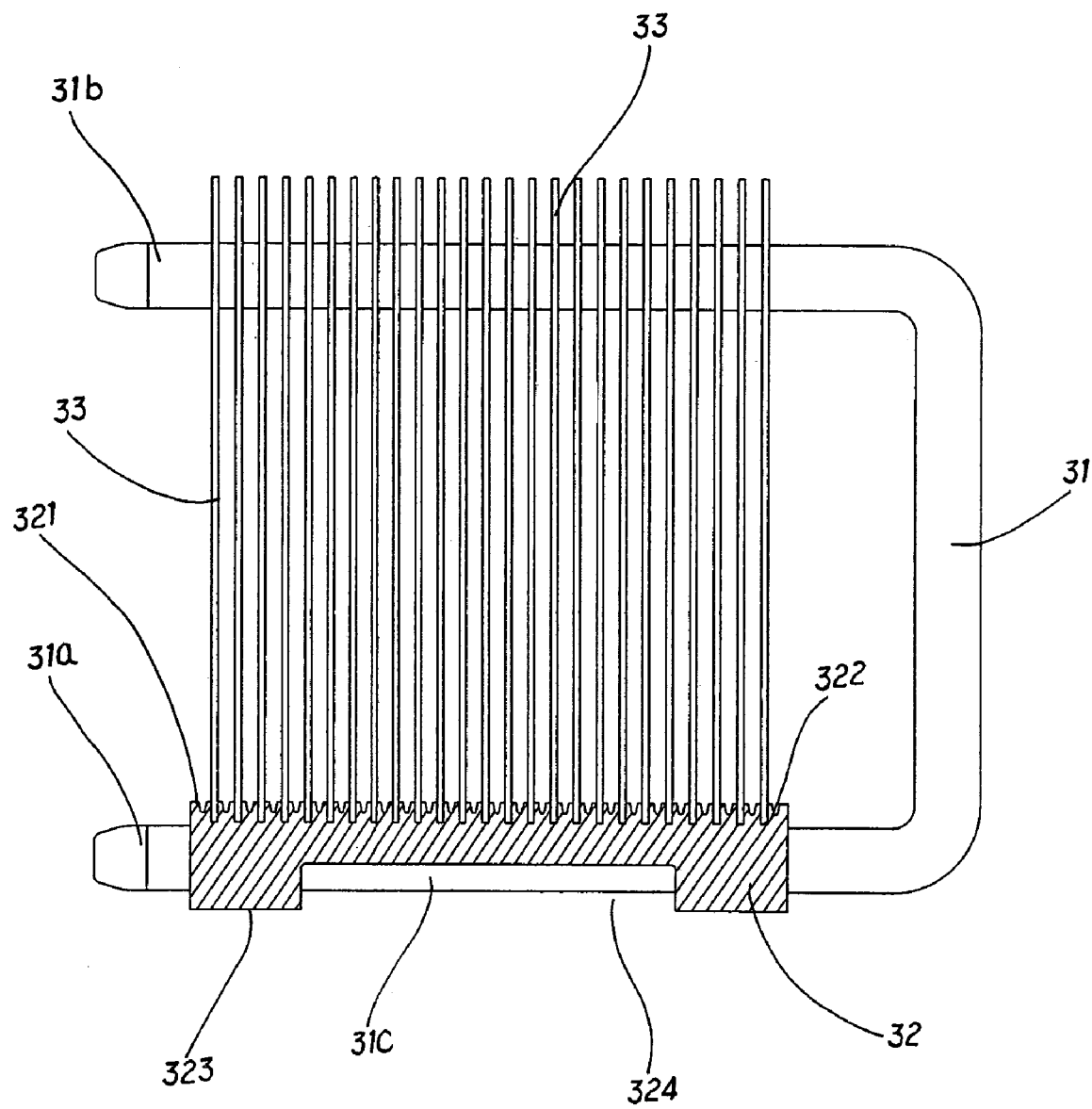
FIG. 4 is a side view of the cooler in FIG. 3.
Figure 5:
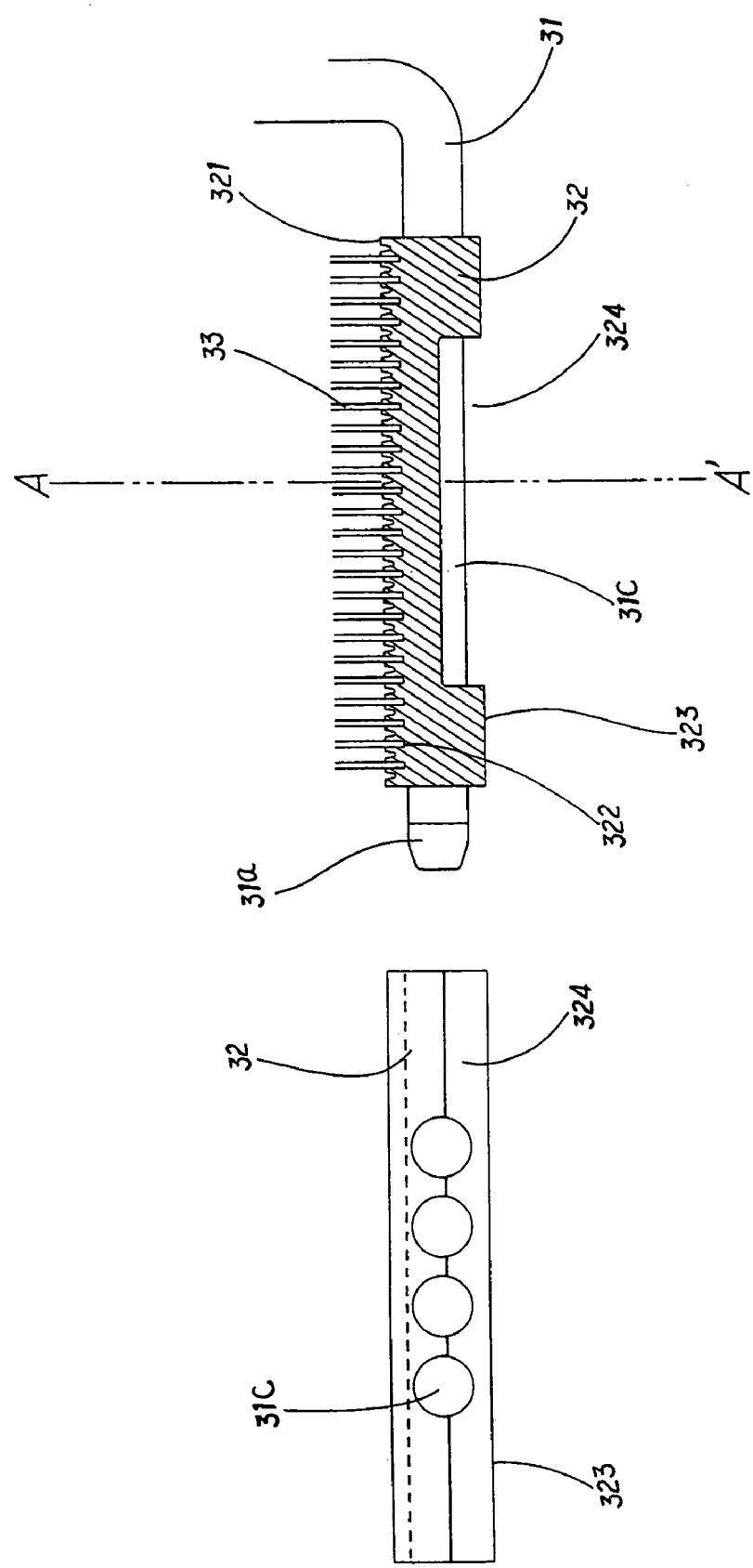
FIG. 5 shows the configuration of the heat pipes before punching and the A-A' cross-sectional view of the first preferred embodiment.
Figure 6:
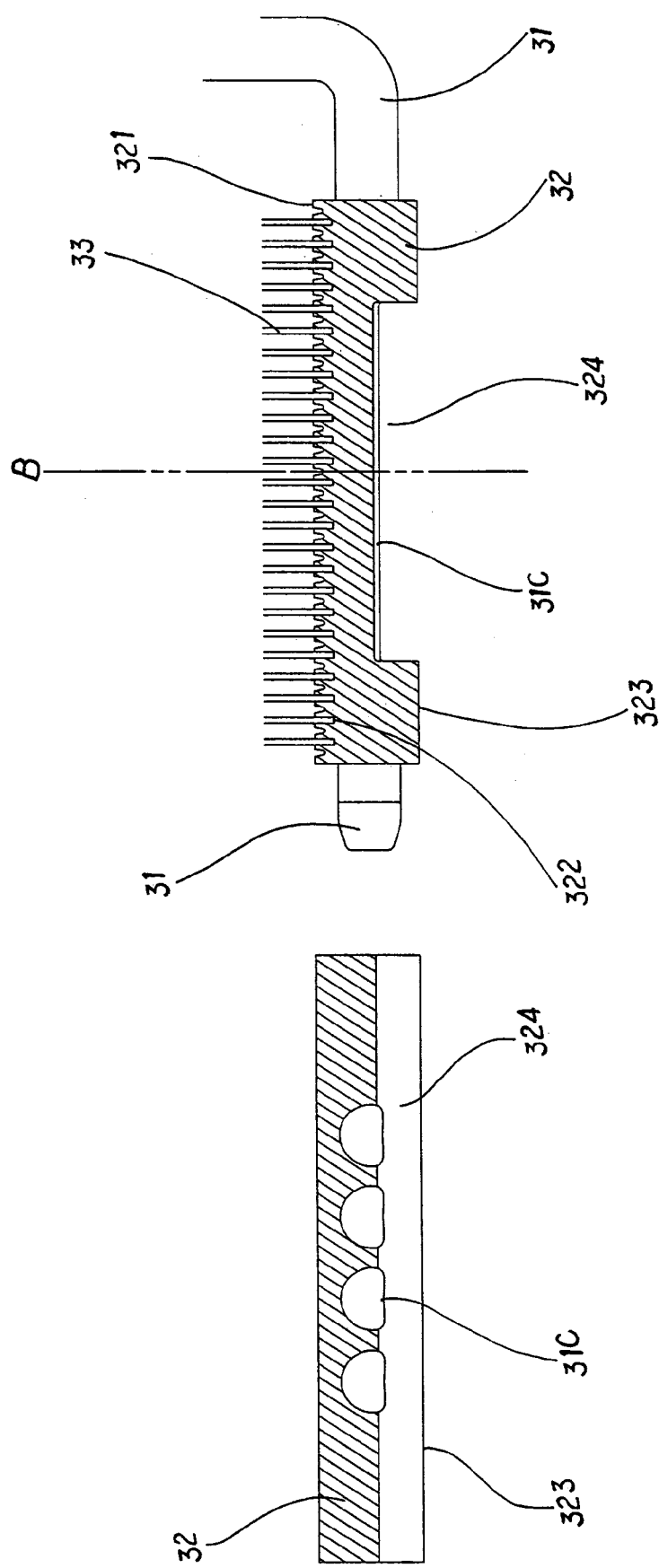
FIG. 6 shows the configuration of the heat pipes after punching and the B-B' cross-sectional view of the first preferred embodiment.

Referring to FIGS. 4, 5 and 6, the relation between the heat pipes 31 and the base 32 is illustrated by a series of side views. In FIG. 4, a section 31c of each of the heat pipes 31 passing through the base 32 is exposed with in the recess 324 formed on the bottom surface. The depth of the recess 324 is about half of the height of the base 32. The depth of the recess 324 is determined by the area exposed with in the recess 324, and therefore the depth varies. In FIGS. 5 and 6, the sections 31c of the heat pipes 31 may have varied cross sections. In FIG. 5, the cross section is not varies, whereas in FIG. 6, the cross section has a flattened lower side for increasing the contact area with the heat-generating element 5.

Figure 7:
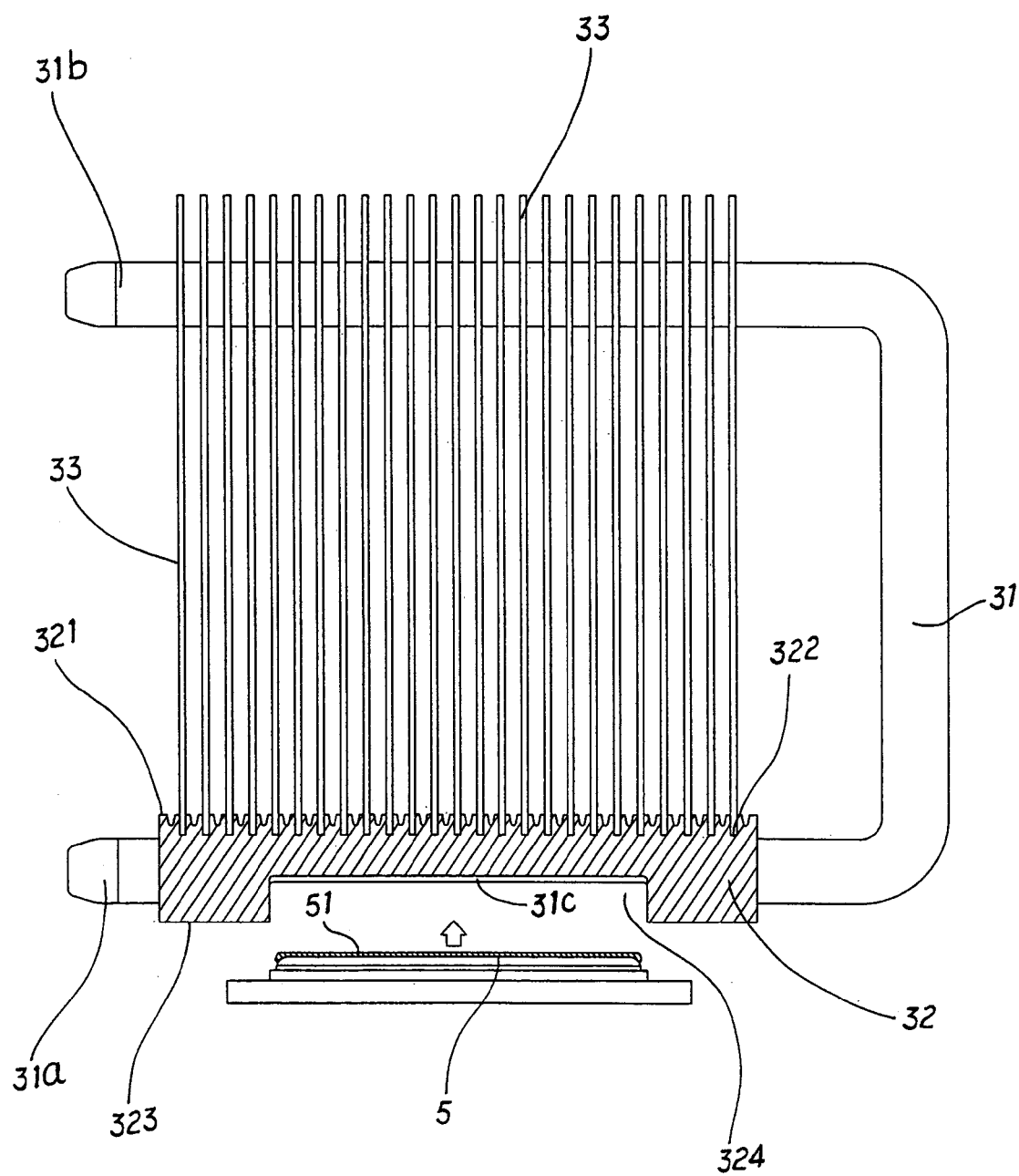
FIG. 7 illustrates the first preferred embodiment before mounting on a heat-generating element.

Referring to FIG. 7, the heat-generating element 5 is applied with a layer of heat-conduction paste 51 on the surface to be in contact with the heat pipes 31, so that the heat dissipation of the heat-generating element 5 to the radiator fins 33 through the heat pipes 31 can be further enhanced.

Figure 8:
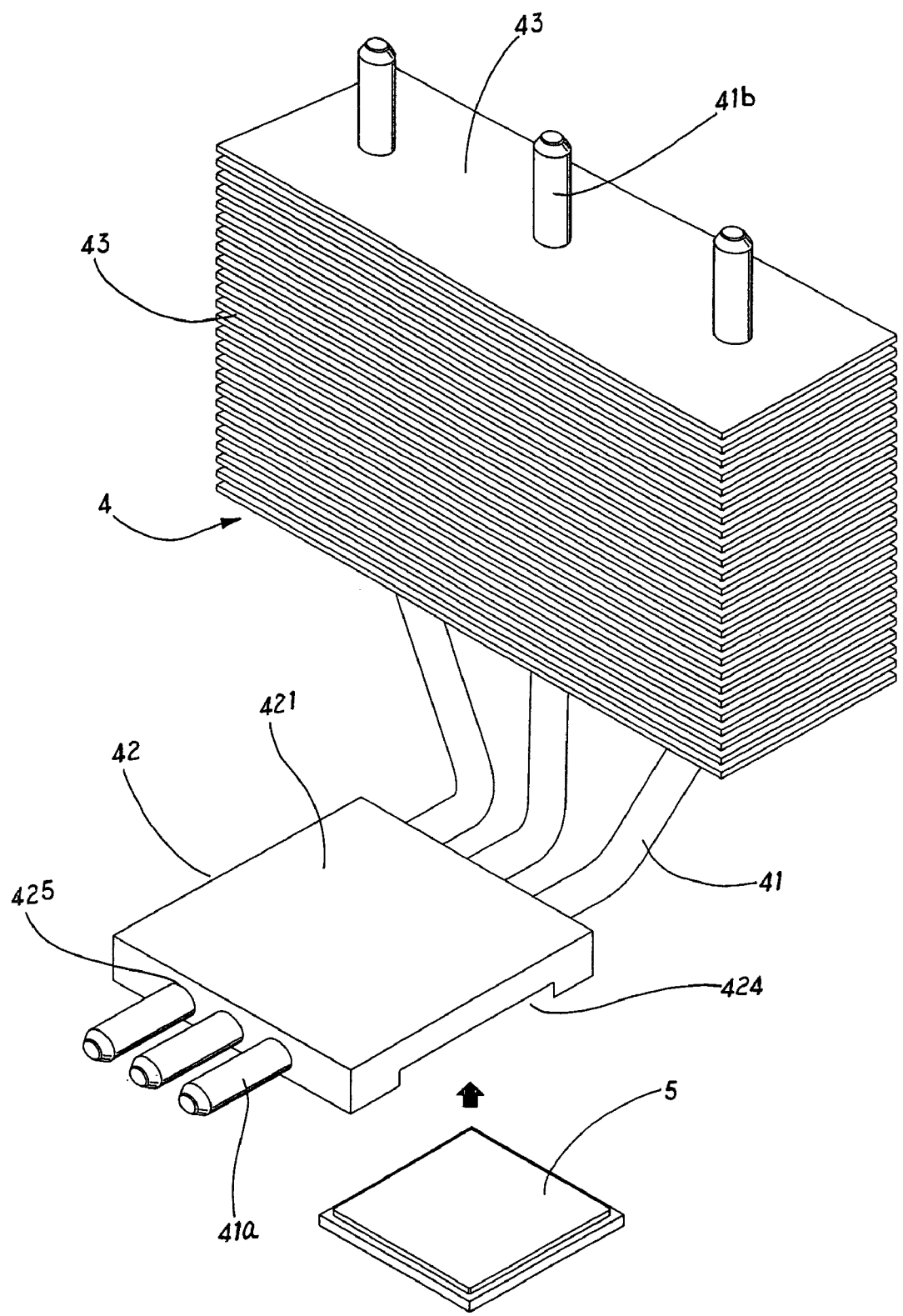
FIG. 8 is a perspective view of the second preferred embodiment of the present invention as a cooler.
Figure 9:
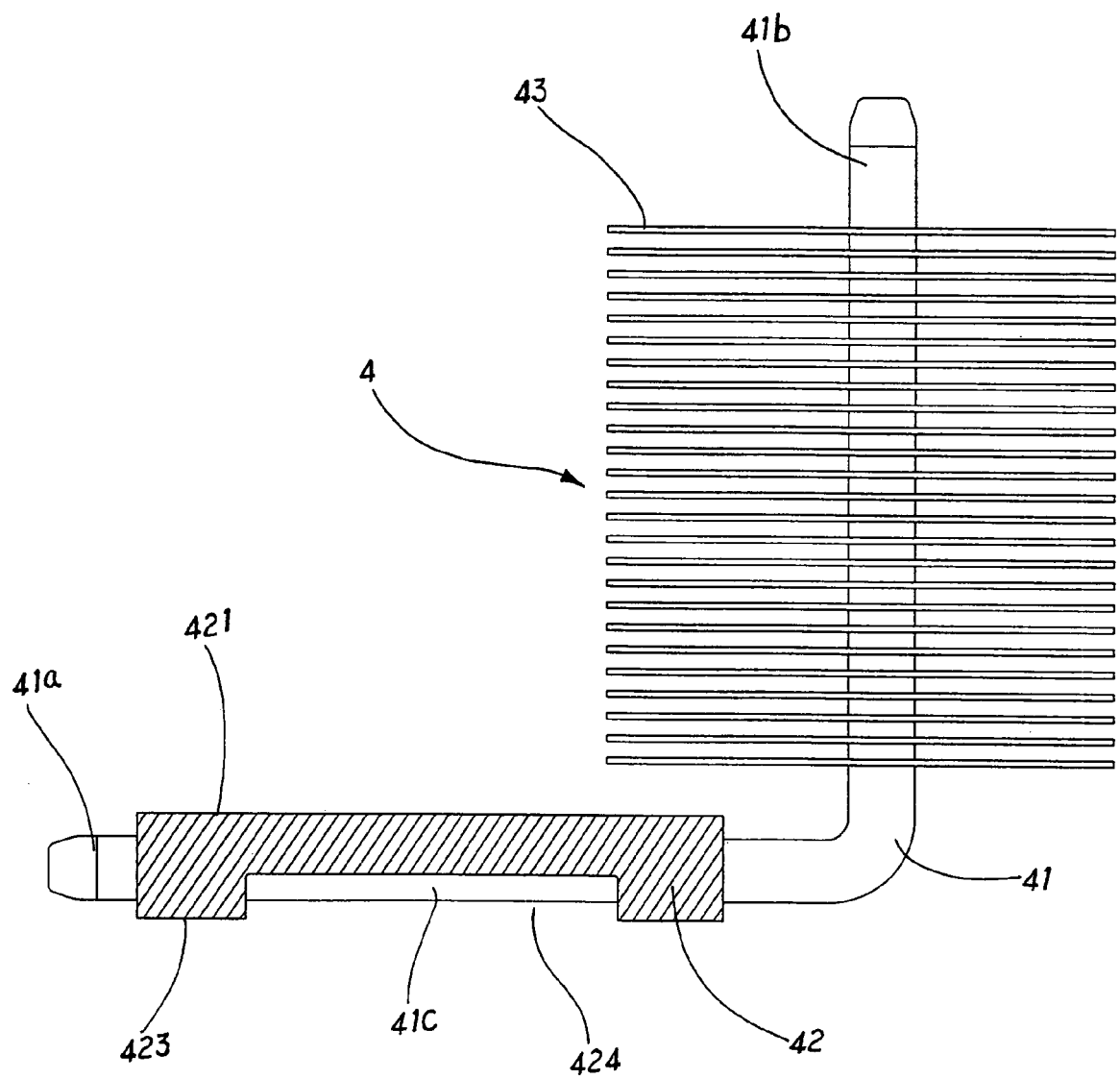
FIG. 9 is a side view of the second preferred embodiment.
Figure 12:
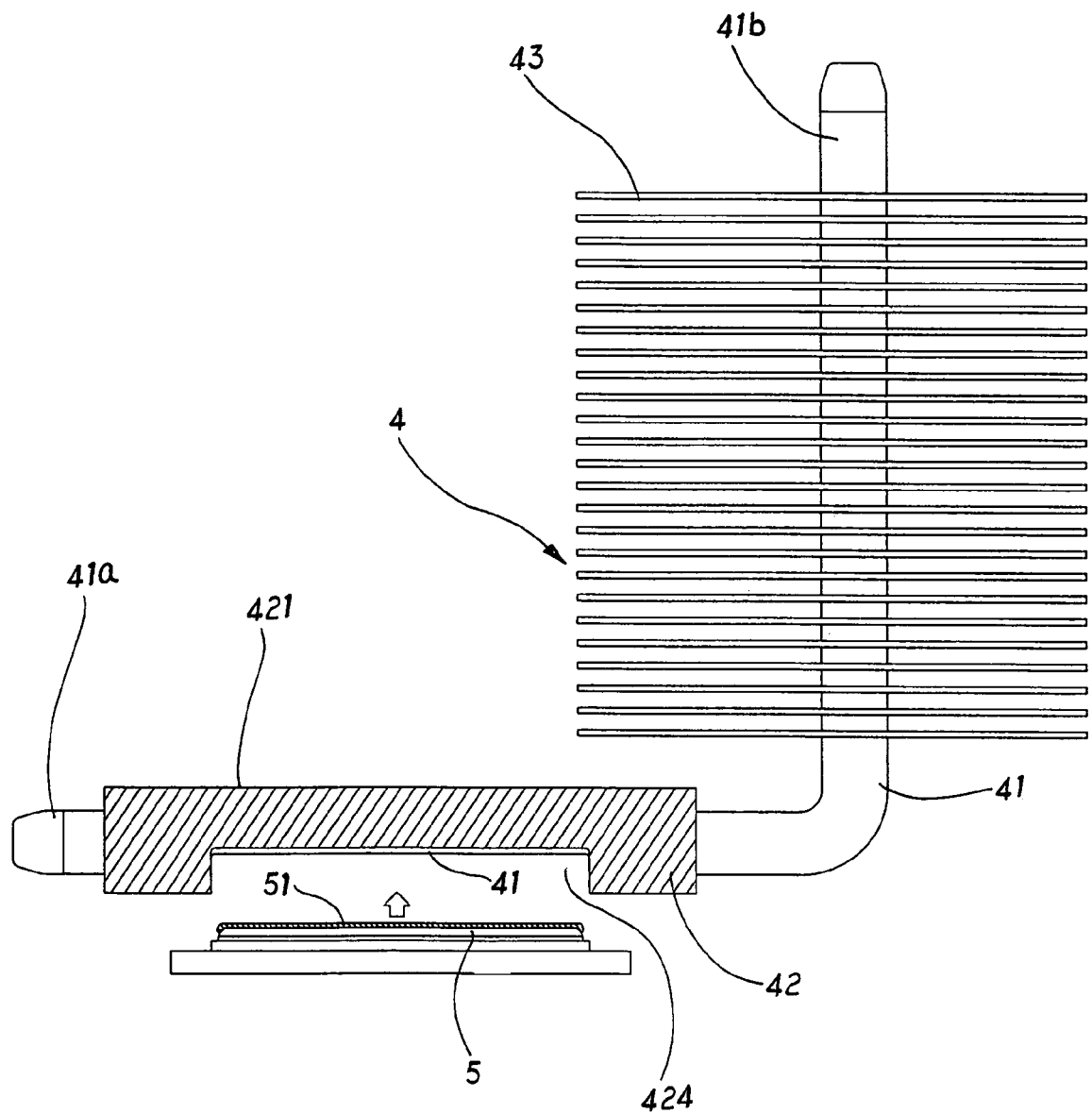
FIG. 12 illustrates the second preferred embodiment before mounting on a heat-generating element.

Referring to FIG. 8, the second preferred embodiment of the present invention is a color 4 comprising a base 42, a set of radiator fins 43 and a plurality of heat pipes 41. The base 42 further comprises a recess 424 on the bottom surface thereof taking the shape of a predetermined heat-generating element 5. The heat pipes 41 pass through the base 42 horizontally through holes 425 so that part of the heat pipes 41 is exposed in the recess 424. The lower ends 41a of the lower terminals of the heat pipes 41 pass through the base 42, connecting the heat pipes 41 and the base 42. The heat pipes 41 are bent upward so that the other terminals 41b thereof pass through the set of radiator fins 43 in the vertical direction, whereby the heat pipes 41 and the radiator fins 43 are connected. Since part of the heat pipes 41 is exposed within the recess 424, the heat-generating element 5 embedded therein will contact the heat pipes 41 directly, whereby the heat generated In the element 5 will be conducted quickly through the heat pipes 41 to the radiator fins 43. Therefore, the heat-dissipation efficiency is enhanced. The associated side-view illustration is in FIG. 9.

Referring to FIGS. 10 and 11, the way the heat pipes 41 going through the base 42 varies. In FIG. 10, the pipes 42 are passing through independent through holes 425, whereas in FIG. 11, the heat pipes 41 are in contact side by side; that is, the through holes 425 are connected. The other configurations of the heat pipes 41 will fall in the scope of the present invention and therefore will not be considered in details here.

The second preferred embodiment as shown in FIGS. 10 and 11 is different form the first preferred embodiment in the location of the radiator fins 43, which is mounted on the vertical terminals 41b of the heat pipes 41 in a vertical configuration located adjacent to an air exit of the electronic device. At the same time, the set of radiator fins 43 is placed away from the heat-generating element 5. Again, the heat-generating element 5 is applied with a layer of heat-conduction paste 51 on the surface to be in contact with the heat pipes 41, so that the heat dissipation of the heat-generating element 5 to the radiator fins 43 through the heat pipes 41 can be further enhanced.

Figure 13:
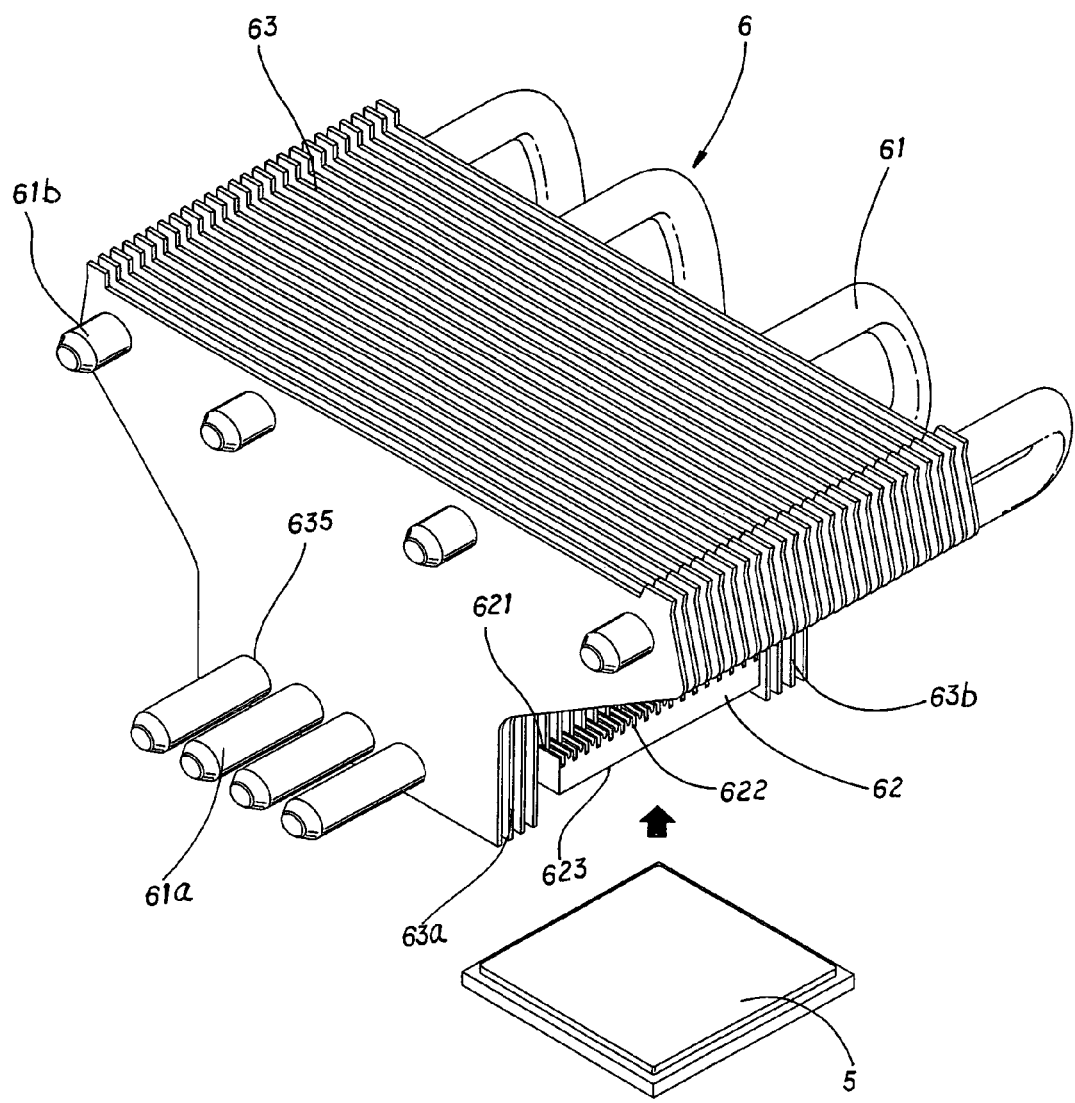
FIG. 13 is a perspective view of the third preferred embodiment of the present invention as a cooler.
Figure 14:
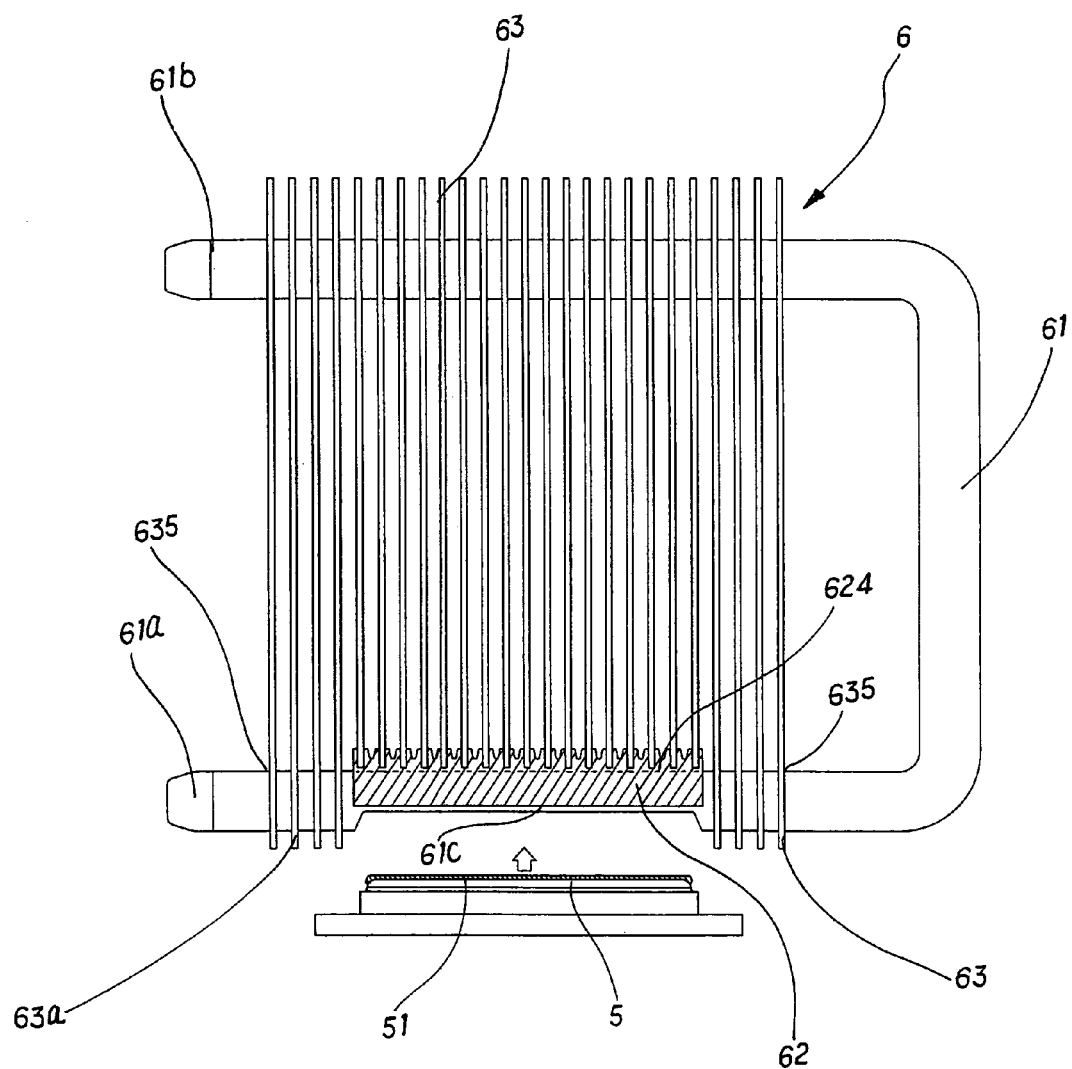
FIG. 14 is a side view of the third preferred embodiment.

Referring to FIGS. 13 and 14, the third preferred embodiment of the present invention is a color 6 comprising a base 62, a set of radiator fins 63 and a plurality of heat pipes 61. The base 62 has a multitude of retaining slots 622 on the top surface thereof for respectively retaining the radiator fins 63. The base 62 further comprises a recess 624 on the bottom surface thereof taking the shape of a predetermined heat-generating element 5. The left and right sides of the radiator fins 63a, 63b are longer and respectively have through holes 635 for the passage of the heat pipes 61. In other words, the base 62 does not have through for retaining the heat pipes 61; the heat pipes 61 go though the base 62 along the recess thereof. The heat pipes 61 will be integrated with the base 62 by punching, in which the lower lateral sides of the heat pipes exposed within the recess 624 will become flat, increasing the contact area with the heat-generating element 5.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A cooler, comprising:
a cooler (3) comprises a base (32), a set of radiator fins (33) and a plurality of heat pipes (31); wherein
the base (32) has a multitude of retaining slots (322) on a top surface thereof for respectively retaining the radiator fins (33) and enlarging the heat conducting areas; the fins are wider upwards for heat dissipation; the base (32) has a recess (324) on a bottom surface thereof; the bottom surface has a shape corresponding to a shape of an upper side of a predetermined heat-generating element (5); the base (32) has a plurality of holes (325);
the heat pipes (31) pass through the base (32) horizontally through the holes (325) so that parts of the heat pipes (31) are exposed in the recess (324); the parts of the heat pipes (31) exposed in the recess (324) have flat bottom surfaces for contacting the heat-generating element (5); Lower ends (31a) of lower terminals of the heat pipes (31) are exposed out of the holes (325) of the base (32) for heat dissipation, connecting the heat pipes (31) and the base (32); the heat pipes (31) are bent and folded so that the other terminals (31b) thereof pass through the set of radiator fins (33) in the wider upper ends thereof in the same horizontal direction;
whereby the heat pipes (31) and the radiator fins (33) are connected; since parts of the heat pipes (31) are exposed within the recess (324), the heat-generating element (5) embedded therein will contact the heat pipes (31) directly, whereby the heat generated in the element (5) will be conducted quickly through the heat pipes (31) to the radiator fins (33); therefore, the heat-dissipation efficiency is enhanced.

2. The cooler of claim 1 wherein said upper surface of said base is provided with a multitude of retaining slots for retaining said radiator fins, and wherein said heat pipes going through said radiator fins are parallel to said through holes in said base.

3. The cooler of claim 1 wherein a layer of heat-conducting paste is applied between said heat pipes and said heat-generating element.

4. The cooler of claim 1 wherein said upper surface of said base is flat and wherein said set of radiator fins is separated from said base for more efficient heat dissipation.

5. The cooler of claim 1 wherein said through holes within said base are not connected.

6. The cooler of claim 1 wherein said through holes within said base are tangentially connected.

\* \* \* \* \*